(12) United States Patent
Lee et al.

(10) Patent No.: US 11,042,237 B2
(45) Date of Patent: Jun. 22, 2021

(54) DISPLAY DEVICE

(71) Applicant: SAMSUNG DISPLAY CO., LTD., Yongin-si (KR)

(72) Inventors: Hyeon Bum Lee, Hwaseong-si (KR); Jin Whan Jung, Chungcheongnam-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/715,768

(22) Filed: Dec. 16, 2019

(65) Prior Publication Data
US 2020/0285337 A1 Sep. 10, 2020

(30) Foreign Application Priority Data
Mar. 6, 2019 (KR) .................. 10-2019-0025877

(51) Int. Cl.
*G06F 3/041* (2006.01)
*H01L 27/32* (2006.01)
*H01L 51/52* (2006.01)

(52) U.S. Cl.
CPC ........ *G06F 3/0412* (2013.01); *H01L 27/3246* (2013.01); *H01L 51/525* (2013.01); *G06F 2203/04103* (2013.01); *G06F 2203/04112* (2013.01)

(58) Field of Classification Search
CPC .... G06F 3/0412; G06F 3/0443; G06F 3/0445; G06F 3/0446; G06F 2203/04103; G06F 2203/04112; H01L 27/3246; H01L 51/525

USPC .......................................................... 345/156
See application file for complete search history.

(56) References Cited

U.S. PATENT DOCUMENTS

| | | | |
|---|---|---|---|
| 2009/0103021 A1* | 4/2009 | Manabe | G02F 1/13394 349/106 |
| 2012/0105347 A1* | 5/2012 | Pak | G06F 3/0412 345/173 |
| 2015/0309637 A1* | 10/2015 | Sakuishi | H01L 27/1214 345/174 |
| 2017/0357345 A1* | 12/2017 | Ikeda | G06F 3/044 |
| 2020/0194503 A1* | 6/2020 | Jo | H01L 51/56 |

FOREIGN PATENT DOCUMENTS

| | | |
|---|---|---|
| KR | 10-1407850 | 6/2014 |
| KR | 10-2018-0105767 | 9/2017 |
| KR | 10-2017-0112441 | 10/2017 |
| KR | 10-1886801 | 8/2018 |
| KR | 10-2018-0112165 | 10/2018 |
| KR | 10-1902006 | 10/2018 |

* cited by examiner

*Primary Examiner* — Tom V Sheng
(74) *Attorney, Agent, or Firm* — F. Chau & Associates, LLC

(57) ABSTRACT

A display device that includes a substrate and a bank layer disposed on the substrate. The bank layer defines an emission area and a non-emission area of a pixel. A spacer is disposed on a portion of the bank layer. A touch member is disposed above the spacer. At least one overcoat layer is disposed on the touch member. A dielectric constant of the at least one overcoat layer in a region overlapping the spacer in a thickness direction of the substrate is larger than a dielectric constant of the overcoat layer in a region that does not overlap the spacer in the thickness direction of the substrate.

22 Claims, 16 Drawing Sheets

EMA: EMA_B, EMA_R, EMA_G

| | |
|---|---|
| Protective layer | ~WDL |
| Polarization layer | ~POL |
| Light-blocking pattern layer | ~BML |
| Touch layer | ~TSL |
| Encapsulation layer | ~ENL |
| Emissive layer | ~EML |
| Circuit-driving layer | ~DRL |
| Substrate | ~SUB |

| | |
|---|---|
| Protective layer | WDL |
| Polarization layer | POL |
| Touch layer | TSL |
| Light-blocking pattern layer | BML |
| Encapsulation layer | ENL |
| Emissive layer | EML |
| Circuit-driving layer | DRL |
| Substrate | SUB |

DISPLAY DEVICE

This application claims priority under 35 U.S.C. § 119 to Korean Patent Application No. 10-2019-0025877, filed on Mar. 6, 2019 in the Korean Intellectual Property Office, the disclosure of which is incorporated herein by reference in its entirety herein.

TECHNICAL FIELD

The present disclosure relates to a display device, and more particularly, to a display device including a touch member.

DISCUSSION OF RELATED ART

Electronic devices having a display device for displaying images to a user include smart phones, tablet PCs, digital cameras, laptop computers, navigation devices and smart TVs. The display devices on these electronic devices may include a display panel for generating and displaying an image and various input means.

Touch panels that recognize a touch input of the user have been widely used in display devices for smart phones and tablet PCs. A touch panel determines whether a touch input is received and obtains the coordinates of the position of the touch input. The touch panel comprises a plurality of sensing electrodes. The touch sensitivity may vary depending on the capacitance around the sensing electrodes. For example, if there is a step in the display panel, the capacitance may be affected by the presence of the step. As a result, there may be a variation in the touch sensitivity for different portions of the display panel.

SUMMARY

Aspects of the present disclosure provide a display device that can reduce a variation in the touch sensitivity.

It should be noted that objects of the present disclosure are not limited to the above-mentioned object; and other objects of the present invention will be apparent to those skilled in the art from the following descriptions.

An exemplary embodiment of a display device includes a substrate and a bank layer disposed on the substrate. The bank layer defines an emission area and a non-emission area of a pixel. A spacer is disposed on a portion of the bank layer. A touch member is disposed above the spacer. At least one overcoat layer is disposed on the touch member. A dielectric constant of the at least one overcoat layer in a region overlapping the spacer in a thickness direction of the substrate is larger than a dielectric constant of the overcoat layer in a region that does not overlap the spacer in the thickness direction of the substrate.

An exemplary embodiment of a display device includes a substrate and a bank layer disposed on the substrate. The bank layer defines an emission area and a non-emission area of a pixel. A spacer is disposed on a portion of the bank layer. At least one overcoat layer is disposed on an encapsulation layer disposed above the bank layer. A touch member is disposed on the at least one overcoat layer. A dielectric constant of the at least one overcoat layer in a region overlapping the spacer in a thickness direction of the substrate is smaller than a dielectric constant of the overcoat layer in a region that does not overlap the spacer in the thickness direction of the substrate.

According to an exemplary embodiment of the present inventive concepts, a method for manufacturing a display device includes forming a bank layer disposed on the substrate, the bank layer defining an emission area and a non-emission area of a pixel. A spacer is formed on a portion of the bank layer. A touch member is formed above the spacer. At least one overcoat layer is disposed above the touch member or on an encapsulation layer disposed above the bank layer and below the touch member. A dielectric constant of the at least one overcoat layer in a region overlapping the spacer in the thickness direction of the substrate is different than a dielectric constant of the overcoat layer in a region that does not overlap the spacer in the thickness direction of the substrate.

According to an exemplary embodiments of the present inventive concepts, even if there is a step difference resulting from a spacer in a display device, variations in touch sensitivity may be reduced by compensating for the touch sensitivity in that position.

It should be noted that effects of the present disclosure are not limited to those described above and other effects of the present inventive concepts will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which:

FIG. 3 is a cross-sectional view showing an example of a stack structure of a display panel according to an exemplary embodiment of the present inventive concepts.

FIG. 4 is a cross-sectional view showing an example of a stack structure of a display panel according to another exemplary embodiment of the present inventive concepts.

DETAILED DESCRIPTION OF THE EXEMPLARY EMBODIMENTS

The present invention will now be described more fully hereinafter with reference to the accompanying drawings, in which exemplary embodiments of the invention are shown.

This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more exemplary embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, exemplary embodiments of the present disclosure will be described with reference to the accompanying drawings.

Figure 1:
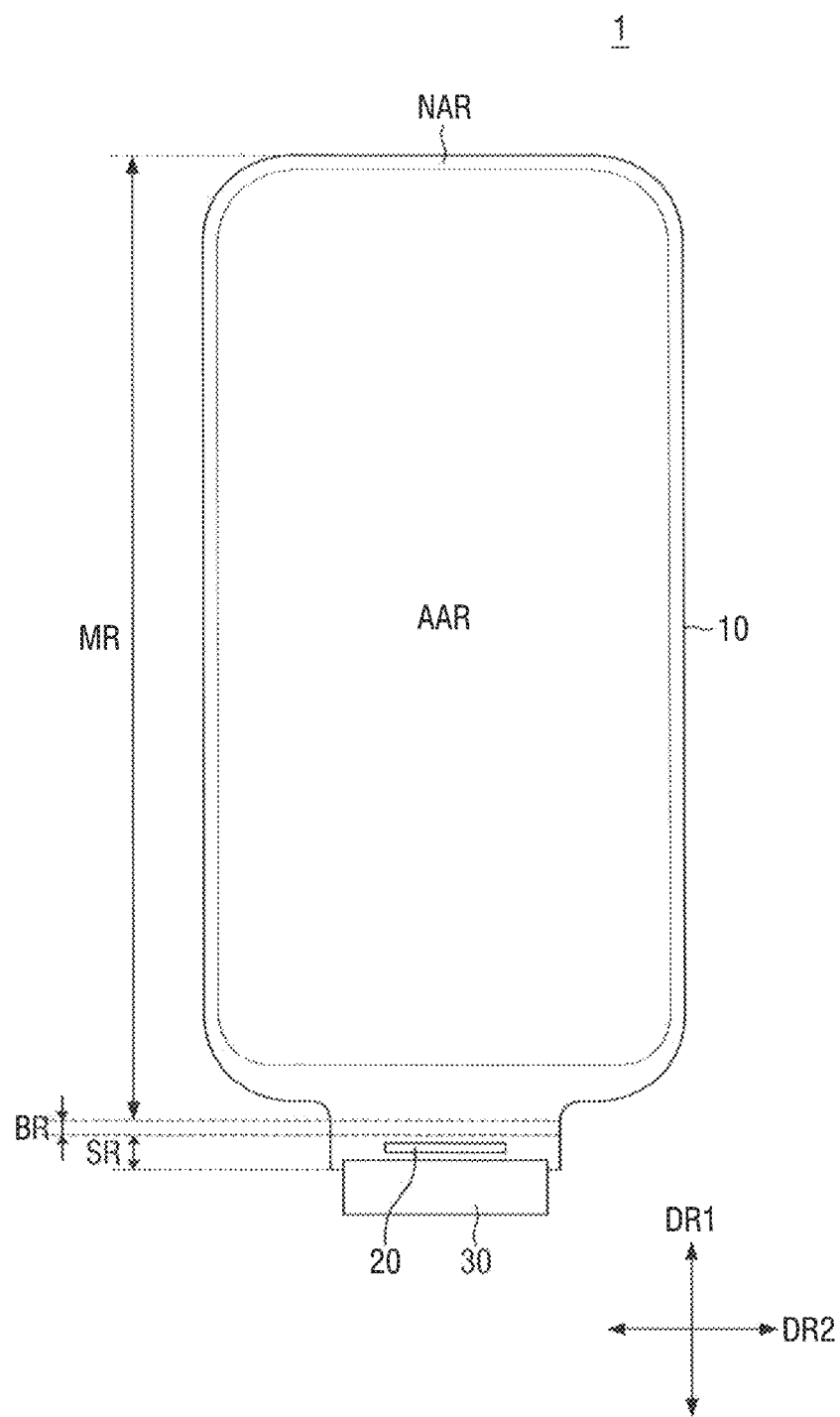
FIG. 1 is a plan view of a display device according to an exemplary embodiment of the present inventive concepts.
Figure 2:
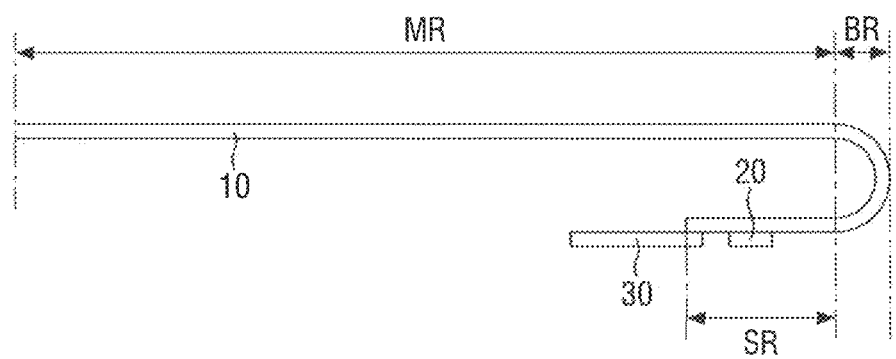
FIG. 2 is a cross-sectional view of a part of a display device according to an exemplary embodiment of the present inventive concepts.

FIG. 1 is a plan view of a display device according to an exemplary embodiment of the present disclosure. FIG. 2 is a cross-sectional view of a part of a display device according to an exemplary embodiment of the present disclosure.

In some exemplary embodiments, the first direction DR1 may intersect the second direction DR2. As shown in the exemplary embodiment of FIG. 1, the first direction DR1 may be a generally vertical direction and the second direction DR2 may be a generally horizontal direction. In the following description, the upper arrow in the first direction DR1 points towards an upper side, the lower arrow in the first direction DR1 points towards a lower side, the right arrow in the second direction DR2 points towards the right side, and the left arrow in the second direction DR2 points towards the left side when viewed from the top (e.g., in a direction perpendicular to the first direction DR1 and second direction DR2). It should be understood that the directions referred with respect to the exemplary embodiments are relative directions, and the exemplary embodiments of the present inventive concepts are not limited to the directions mentioned.

Referring to FIGS. 1 and 2, a display device 1 may refer to any electronic device providing a display screen. The display device 1 may include a variety of portable electronic devices that include a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera. The display device 1 may also include a television, a laptop computer, a monitor, an electronic billboard, an Internet of Things device, or another electronic device including a display screen.

The display device 1 includes an active area AAR and a non-active area NAR. In the display device 1, a display area may be defined as an area where images are displayed while a non-display area may be defined as an area where images are not displayed. The touch region may be defined as an area where a touch input is sensed. The display area and the touch region may be included in the active area AAR. The display area and the touch region may overlap with each other in the active area AAR. As a result, images may be displayed and a touch input may be sensed. In an exemplary embodiment, the shape of the active area AAR may be a rectangle or a rectangle with rounded corners. In the exemplary embodiment shown in FIG. 1, the shape of the active area AAR is a rectangle that has rounded corners. The sides of the active area in the first direction DR1 are relatively long and the sides of the active area in the second direction DR2 are relatively short. It is, however, to be understood that the present disclosure is not limited thereto. The active area AAR may have various shapes such as a rectangular shape with its sides in the second direction DR2 longer than its sides in the first direction DR1, a square shape, other polygonal shapes, a circular shape, an elliptical shape, etc.

The non-active area NAR may be disposed around the active area AAR. For example, the non-active area NAR may be a bezel area. The non-active area NAR may surround all sides of the active area AAR, such as the four sides shown in FIG. 1. It is, however, to be understood that the present disclosure is not limited thereto. For example, the non-active area NAR may not be disposed to surround the upper side of the active region AAR or the left or right side of the active region AAR.

Signal lines for applying signals to the active area AAR (display area or touch region) or driving circuits may be disposed in the non-active area NAR. The non-active area NAR may not include a display area. Further, the non-active area NAR may not include a touch region. In another exemplary embodiment, the non-active area NAR may include a portion of the touch region, and a sensor member such as a pressure sensor may be disposed in that portion of the touch region. However, in some exemplary embodiments, the touch area may solely be in the display area and the active area AAR may have both the display area and the touch area while the non-active area NAR does not have a touch region.

The display device 1 may include a display panel 10 for providing a display screen for generating images. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc In the exemplary embodiments described herein, an organic light-emitting display panel may be employed as the display panel 10.

The display panel 10 may include a plurality of pixels. The plurality of pixels may be arranged in a matrix. The shape of each pixel may be a rectangle or a square when viewed from the top. However, exemplary embodiments of the present inventive concepts are not limited to these shapes for the matrix of pixels. Each pixel may have a diamond shape having sides inclined with respect to the first direction DR1. Each pixel may include an emission area. Each emission area may have the same shape or a different shape as compared to the shape of the pixels. For example, when the pixels have a rectangular shape, the shape of the emission area of each of the pixels may have various shapes such as a rectangle, a diamond, a hexagon, an octagon, and a circle. A detailed description of the pixels and the emission areas will be given later.

The display device 1 may further include a touch member for sensing a touch input. The touch member may be provided as a separate panel or film from the display panel 10 to be attached on the display panel 10 or may be provided in the form of a touch layer inside the display panel 10. In the following description, the touch member is provided in the form of a touch layer inside the display panel 10. However, exemplary embodiments of the present inventive concepts are not limited thereto.

The display panel 10 may include a flexible substrate having a flexible polymer material such as polyimide. Accordingly, the flexible substrate may permit the display panel 10 to be curved, bent, folded, or rolled.

The display panel 10 may include a bending region BR. The display panel 10 may be divided into a main region MR located on one side of the bending region BR and a subsidiary region SR located on the other side of the bending region BR. For example, in the embodiment shown in FIG. 1, the subsidiary region is located on a lower portion of the display panel in the first direction DR1 and the main region is located from the uppermost portion of the display region to the bending region BR in the first direction.

The display area of the display panel 10 may be located in the main region MR. In an exemplary embodiment, the edge portion along the periphery of the display area in the main region MR, the entire bending region BR and the entire subsidiary region SR may be the non-display area. However, the present disclosure is not limited thereto. For example, the bending region BR and/or the subsidiary region SR in other exemplary embodiments may also include the display area.

The main region MR may have a shape generally similar to that of the display device 1 when viewed from the top. In an exemplary embodiment, the main region MR may be a flat area located in one plane. It is, however, to be understood that the present disclosure is not limited thereto. At least one of the edges of the main region MR except for the edge (side) connected to the bending region BR may be bent to form a curved surface or may be bent at a right angle.

When at least one of the edges of the main region MR except for the edge connected to the bending region BR is curved or bent, the display area may also be disposed at the edge. It is, however, to be understood that the present disclosure is not limited thereto. For example, the curved or bent edge may be the non-display area that does not display image, or the display area and the non-display area may be disposed together.

The bending region BR may be connected to one side of the main region MR in the first direction DR1. For example, the bending region BR may be connected to the lower shorter side of the main region MR and may extend in the second direction DR2. The width of the bending region BR (e.g., the length extending in the second direction DR2) may be less than the width (width of the shorter side) of the main region MR. In an exemplary embodiment, the portions where the main region MR meets the bending region BR may be cut in a general L-shape to reduce the width. However, in other exemplary embodiments, the portions where the main region MR meets the bending region may have other shapes which result in a reduction of the width.

As shown in the exemplary embodiment of FIG. 2, in the bending region BR, the display panel 10 may be bent downward in the thickness direction, e.g., in the direction away from the display surface with a curvature. Although the bending region BR may have a constant radius of curvature, the present disclosure is not limited thereto. It may have different radii of curvature for difference sections. As the display panel 10 is bent at the bending region BR, the surface of the display panel 10 may be reversed. Specifically, the surface of the display panel 10 facing upward may be bent such that it faces outward at the bending region BR and then faces downward.

The sub-region SR may be extended in a direction parallel to the main region MR after the display device has been bent. The subsidiary region SR may overlap with the main region MR in the thickness direction of the display panel 10 (e.g., in a direction perpendicular to the first direction DR1 and second direction DR2). The width of the subsidiary region SR (e.g., the length extending in the second direction DR2) may be equal to the width of the bending region BR. However, the width of the subsidiary region SR may be greater than or less than the width of the bending region BR in other exemplary embodiments.

A driver chip integrated circuit (20) may be disposed in the subsidiary region SR. The driving chip IC may include an integrated circuit for driving the display panel 10. The integrated circuit of the driver chip may include an integrated circuit for the display and/or an integrated circuit for a touch unit. The integrated circuit for a display and the integrated circuit for a touch unit may be provided as separate chips or may be integrated into a single chip.

A pad unit may be disposed at the end of the subsidiary region SR of the display panel 10. The pad unit may include display signal line pads and touch signal line pads. A drive substrate (30) may be connected to the pad unit at the end of the subsidiary region SR of the display panel 10. The drive substrate 30 may be a flexible printed circuit board or a film.

FIG. 3 is a cross-sectional view showing an example of a stack structure of a display panel according to an exemplary embodiment of the present disclosure.

Referring to FIG. 3, the display panel 10 may include a circuit-driving layer DRL disposed on a substrate SUB. The circuit-driving layer DRL may include a circuit for driving an emissive layer EML of each pixel. The circuit-driving layer DRL may include a plurality of thin-film transistors.

The emissive layer EML may be disposed on the circuit-driving layer DRL. The emissive layer EML may include an organic emitting layer. The emissive layer EML may emit light with various luminances depending on driving signals transmitted from the circuit-driving layer DRL.

In an exemplary embodiment, an encapsulation layer ENL may be disposed on the emissive layer EML. The encapsulation layer ENL may include an inorganic layer or a stack of at least one inorganic layer and at least one organic layer. In another exemplary embodiment, the encapsulation layer ENL may be glass or a sealing film.

A touch layer TSL may be disposed on the encapsulation layer ENL. The touch layer TSL may sense a touch input and may perform the functions of the touch member. The touch layer TSL may include a plurality of sensing regions and sensing electrodes.

A light-blocking pattern layer BML may be disposed on the touch layer TSL. The light-blocking pattern layer BML may suppress reflection of external light and may improve the color of the reflected light.

In an exemplary embodiment, a polarization layer POL may be disposed on the light-blocking pattern layer BML. The polarization layer POL may reduce the reflection of external light. The polarization layer POL may be attached on the light-blocking pattern layer BML by an adhesive layer. However, in other exemplary embodiments, the polarization layer POL may be eliminated.

A protective layer WDL may be disposed on the polarization layer POL. The protective layer WDL may include, for example, a window member. In an exemplary embodiment, the protective layer WDL may be attached on the polarization layer POL by an optically clear adhesive or the like. In other exemplary embodiments, one or more of the layers shown in the exemplary embodiments of FIG. 3 may be removed or additional layers may be included in the stack structure, such as a color filter layer, capping layer, etc.

FIG. 4 is a cross-sectional view showing an example of a stack structure of a display panel according to another exemplary embodiment of the present disclosure.

Referring to FIG. 4, a display panel 11 according to this exemplary embodiment is different from that according to the exemplary embodiment of FIG. 3 in the stacking order of the touch layer TSL and the light-blocking pattern layer BML. In this embodiment, the light-blocking pattern layer BML may be disposed on the encapsulation layer ENL, and the touch layer TSL may be disposed on the light-blocking pattern layer BML. The polarization layer POL may be disposed or attached on the touch layer.

In the display panel 11 according to this exemplary embodiment, a light-blocking pattern layer BML is disposed under a touch layer TSL and the touch sensitivity may be adjusted differently from the touch sensitivity of the exemplary embodiment of FIG. 3. Detailed descriptions on this will be provided later on.

Hereinafter, the touch member will be described in detail.

Figure 5:
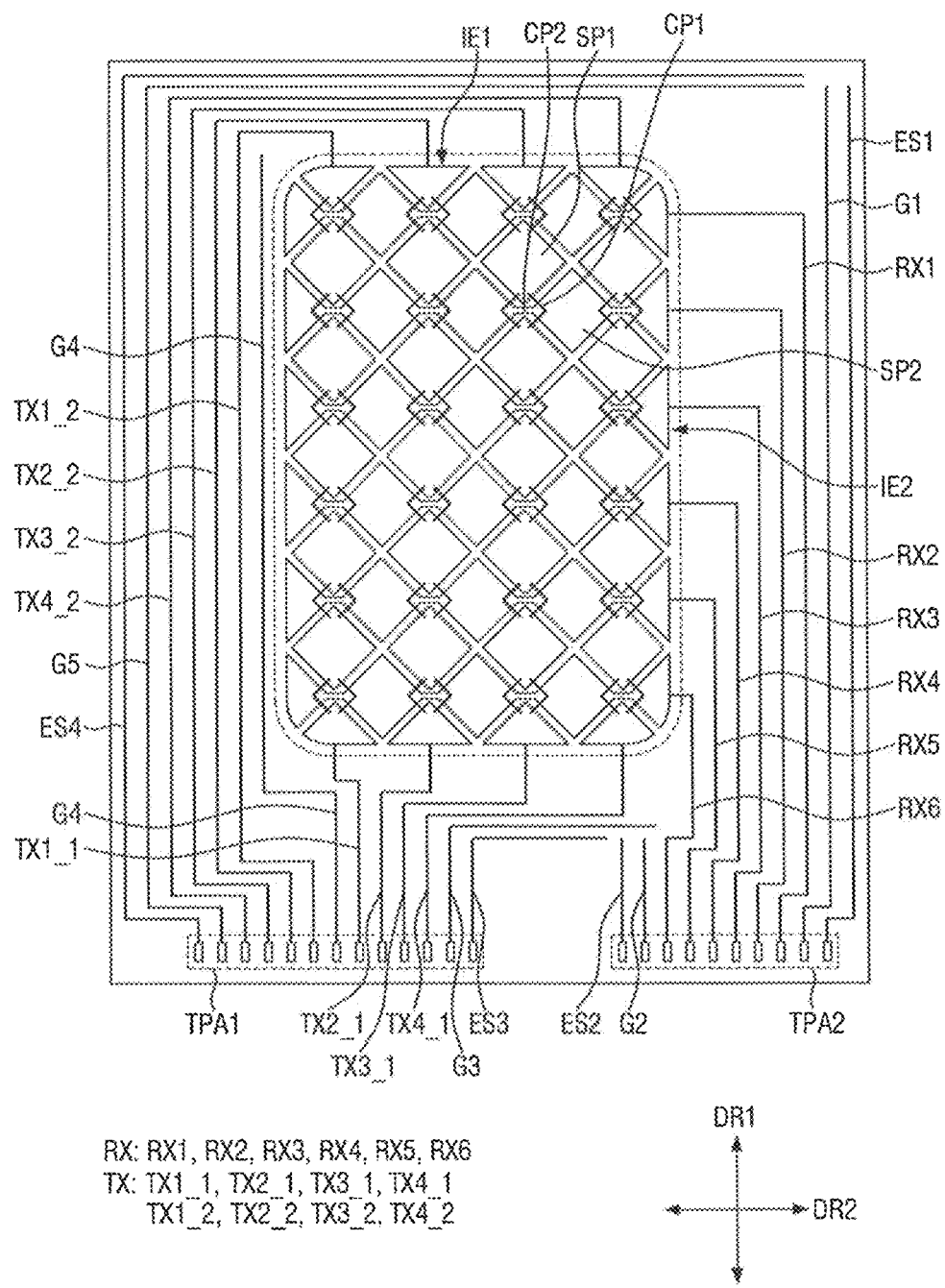
FIG. 5 is a plan view of a touch member according to an exemplary embodiment of the present inventive concepts.

FIG. 5 is a plan view of a touch member according to an exemplary embodiment of the present inventive concepts.

Referring to FIG. 5, a touch member may include a touch region located in the active area AAR and a non-touch region located in the non-active area NAR. Although the touch member is simplified while the non-touch region is exaggerated in FIG. 5 for convenience of illustration, the shapes of the touch region and the shape of the non-touch region may be substantially identical to those of the active area AAR and the non-active area NAR described above.

The touch region of the touch member may include a plurality of first sensing electrodes IE1 (or first touch electrodes) and a plurality of second sensing electrodes IE2 (or second touch electrodes). One of the first sensing electrodes IE1 or the second sensing electrodes IE2 may be driving electrodes and the other of the electrodes may be sensing electrodes. In the exemplary embodiment shown in FIG. 5, the first sensing electrodes IE1 may be driving electrodes while the second sensing electrodes IE2 may be sensing electrodes.

The first sensing electrodes IE1 may be extended in the first direction DR1. The first sensing electrodes IE1 may include a plurality of first sensor parts SP1 arranged in the first direction DR1 and the first connecting parts CP1 electrically connecting between adjacent ones of the first sensor parts SP1. The plurality of first sensing electrodes IE1 may be arranged in the second direction DR2.

The second sensing electrodes IE2 may be extended in the second direction DR2. The second sensing electrodes IE2 may include a plurality of second sensor parts SP2 arranged in the second direction DR2 and the second connecting parts CP2 electrically connecting between adjacent ones of the second sensor parts SP2. The plurality of second sensing electrodes IE2 may be arranged in the first direction DR1.

The amount of the first sensing electrodes IE1 and the second sensing electrodes IE2 shown in FIG. 5 are for convenience of description and exemplary embodiments of the present inventive concepts are not limited to the amount of the electrodes shown in FIG. 5.

At least some of the first sensor parts SP1 and the second sensor parts SP2 may have a substantially diamond shape. Some of the first sensor parts SP1 and the second sensor parts SP2 may have a truncated diamond shape. For example, in the embodiment shown in FIG. 5, all of the first sensor parts SP1 and the second parts SP2 except the first and last ones in the extension direction may have a diamond shape, and each of the first and last ones in the extension direction may have a triangle shape obtained by cutting the diamond shape. The first sensor parts SP1 and the second sensor parts SP2 in the diamond shape may have substantially the same size and shape. The first sensor parts SP1 and the second sensor parts SP2 in the triangle shape may have substantially the same size and shape. However, the present disclosure is not limited thereto and the first sensor parts SP1 and the second sensor parts SP2 may have a variety of shapes and sizes which may differ from each other.

Figure 6:
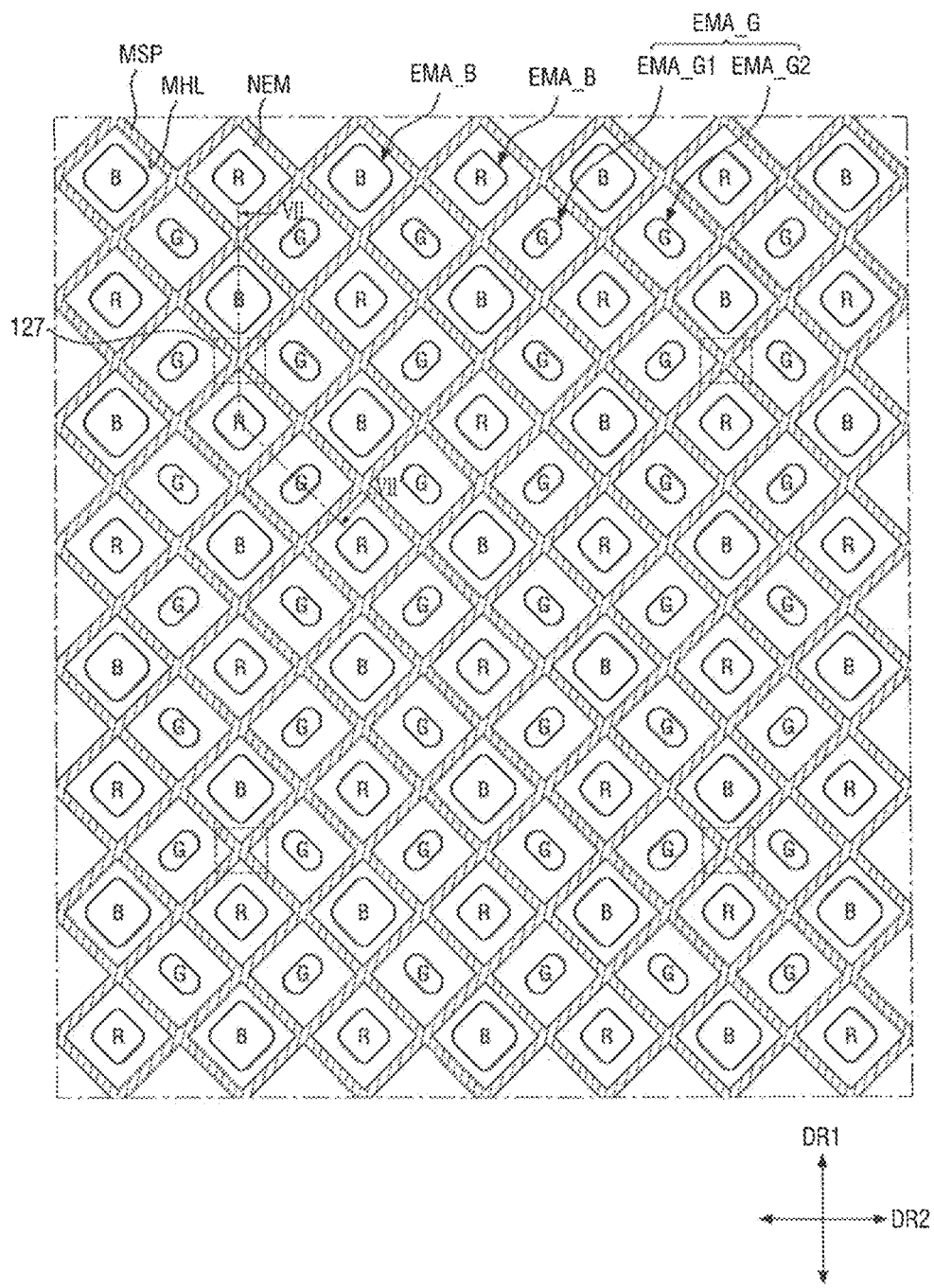
FIG. 6 is an enlarged view of a part of the touch region of FIG. 5 according to an exemplary embodiment of the present inventive concepts.
Figure 8:
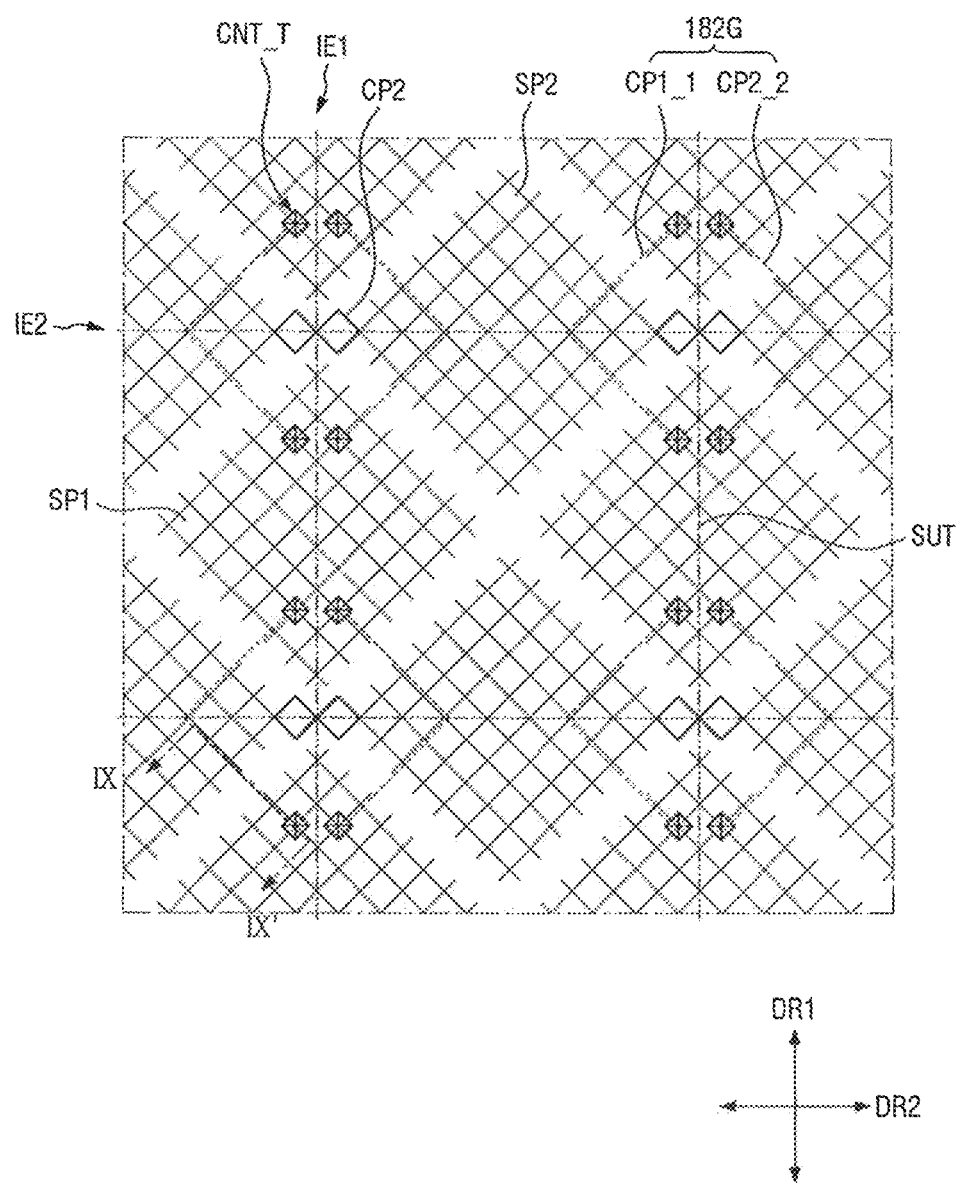
FIG. 8 is a diagram showing the relative arrangement relationship between the pixels and the touch member in a mesh pattern in the display area according to an exemplary embodiment of the present inventive concepts.

The first sensor parts SP1 of the first sensing electrodes IE1 and the second sensor parts SP2 of the second sensing electrodes IE2 may each include a planar pattern or a mesh pattern MSP. When the first sensor parts SP and the second sensor parts SP2 include a planar pattern, the first sensor parts SP1 and the second sensor parts SP2 may be formed as a transparent conductive layer. When the first sensor parts SP1 and the second sensor parts SP2 include a mesh pattern MSP disposed along the non-emission areas as illustrated in FIGS. 6 and 8, the first sensor parts SP1 and the second sensor parts SP2 may be formed as an opaque, low-resistance metal without interfering with the propagation of the emitted light. In the following description, the first sensor parts SP1 and the second sensor parts SP2 may each include a mesh pattern. However, the present disclosure is not limited thereto.

Each of the first connecting parts CP1 may connect a vertex of the diamond or triangle shape of a first sensor part SP1 with that of an adjacent first sensor part SP1. Each of the second connecting parts CP2 may connect a vertex of the diamond or triangle shape of a second sensor part SP2 with that of an adjacent second sensor part SP2. In an exemplary embodiment, the width of the first connecting parts CP1 and the second connecting parts CP2 may be smaller than the width of the first sensor parts SP1 and the second sensor parts SP2.

The first sensing electrodes IE1 and the second sensing electrodes IE2 may be insulated from each other and may intersect each other. Each of the first sensing electrodes IE1 may be connected to adjacent first sensing electrodes by a conductive layer. The second sensing electrodes IE2 may be connected to adjacent second sensing electrodes by another conductive layer disposed on a different layer at the intersections. Therefore, the first sensing electrodes IE1 may be insulated from the second sensing electrodes IE2. Each of the first sensing electrodes IE1 may be connected to adjacent first sensing electrodes by the first connecting parts CP1 while each of the second sensing electrodes IE2 may be connected to adjacent second sensing electrodes by the second connecting parts CP2, so that the first and second sensing electrode may be insulated from each other while intersecting each other. The first connecting parts CP1 and/or the second connecting parts CP2 may be located on a different layer from the first sensing electrode IE1 and the second sensing electrode IE2.

For example, the first sensor parts SP1 of the first sensing electrodes IE1 and the second sensor parts SP2 of the second sensing electrodes IE2 may be formed as a conductive layer located on the same layer. However, the first sensor parts SP1 and the second sensor parts SP2 may neither intersect nor overlap with each other. Adjacent first sensor parts SP1 and second sensor parts SP2 may be physically separated from each other.

The second connecting parts CP2 may be formed on the same conductive layer as the second sensor parts SP2 and may connect adjacent second sensor parts SP2. A first sensor part SP1 of a first sensing electrode IE1 may be physically separated from an adjacent sensor part SP1 thereof with respect to the area where a second connecting part CP2 passes. The first connecting parts CP1 connecting the first sensor parts SP1 may be formed on a different conductive layer from the first sensor parts SP1 and may traverse the area of the second sensing electrodes IE2. Each of the first connecting parts CP1 may be electrically connected to the respective first sensor parts SP1 by a contact.

The first connecting parts CP1 may include additional elements. For example, although not limited thereto, each of the first connection parts CP1 may include a first connecting part CP1_1 which overlaps an adjacent second sensing electrode IE2 on one side, and another first connecting part CP1_2 which overlaps another adjacent second sensing electrode IE2 on the other side. Since a plurality of first connecting parts CP1 connect between two adjacent first sensor parts SP1, it is possible to prevent disconnection of the first sensing electrodes IE1 even if one of the first connecting parts CP1 is broken, such as by static electricity or the like.

The first sensor parts SP1 and the second sensor parts SP2 adjacent to each other may form a unit sensing region SUT (see FIG. 8). For example, in an exemplary embodiment, halves of two first sensor parts SP1 adjacent to each other in the second direction DR2 and halves of two second sensor parts SP2 adjacent to each other in the first direction DR1 may form a square or a rectangle, with respect to the intersection between the first sensing electrodes IE1 and the second sensing electrodes IE2. The area defined by the halves of the adjacent two first sensor parts SP1 and halves of the two adjacent second sensor parts SP2 may be a unit sensing region SUT. A plurality of unit sensing regions SUT may be arranged in row and column directions.

In each of the unit sensing regions SUT, the capacitance value between the adjacent first sensor parts SP1 and the second sensor parts SP2 is measured to determine whether or not a touch input is made. If the capacitance determines that a touch input has been made, the position obtained as touch input coordinates. For example, a touch may be sensed by, for example, measuring mutual capacitance.

In an exemplary embodiment, each unit sensing region SUT may be larger than the size of a pixel. For example, each unit sensing region SUT may have an area equal to the area occupied by a plurality of pixels. For example, the length of a side of the unit sensing area SUT may be in the range of, but is not limited to, 4 to 5 mm.

As shown in FIG. 5, a plurality of touch signal lines may be disposed in the non-active area NAR outside the touch region. The touch signal lines may be extended from the touch pad units TPA1 and TPA2 located in the subsidiary region SR to the non-active area NAR of the main region MR through the bending region BR.

The touch signal lines may include touch driving lines TX and touch sensing lines RX. In an exemplary embodiment, the touch signal lines may further include touch ground lines G.

The touch driving lines TX may be connected to the first sensing electrodes IE1. In an exemplary embodiment, a plurality of touch driving lines may be connected to a single first sensing electrode IE1. For example, in the exemplary embodiment shown in FIG. 5, the touch driving lines may include first touch driving lines TX1_1, TX2_1, TX3_1 and TX4_1 connected to the lower end (e.g., in the first direction DR1) of the first sensing electrodes IE1. Second touch driving lines TX1_2, TX2_2, TX3_2 and TX4_2 may be connected to the upper end (e.g., in the first direction DR1) of the first sensing electrodes IE1. The first touch driving lines TX1_1, TX2_1, TX3_1 and TX4_1 may extend from a touch signal line pad unit TPA1 upwardly in the first direction DR1 and may be connected to the lower end of the first sensing electrodes IE1. The second touch driving lines TX1_2, TX2_2, TX3_2 and TX4_2 may be extended from the touch signal line pad unit TPA1 upwardly in the first direction DR1 and may extend along the left edge of the touch region to be connected to the upper end of the first sensing electrodes IE1.

The touch sensing lines RX may be connected to the second sensing electrodes IE2. In an exemplary embodiment, a single touch sensing line RX may be connected to a single second sensing electrode IE2. As shown in the exemplary embodiment of FIG. 5, the touch sensing lines RX1, RX2, RX3, RX4, RX5 and RX6 may extend upwardly in the first direction DR1 from a touch signal line pad unit TPA2 and may extend along the right edge of the touch region to be connected to the right end of the second sensing electrodes IE2.

The touch electrostatic discharge lines ES may be disposed at an outside of the touch signal lines. In the exemplary embodiment shown in FIG. 5, the touch electrostatic discharge lines may include a first touch electrostatic discharge line ES1, a second touch electrostatic discharge line ES2, a third touch electrostatic discharge line ES3, and a fourth touch electrostatic discharge line ES4. The first to fourth touch electrostatic discharge lines ES may surround the touch region and the signal lines in a substantially ring shape.

The first touch electrostatic discharge line ES1 may cover a touch signal line located on the right side from its outer side. The second touch electrostatic discharge line ES2 may cover a touch signal line located on the right side from its inner side. A third touch electrostatic discharge line ES3 may cover the inner side of a touch signal line located on the left side and the outer side of a touch signal line extending in the second direction DR2 on the lower side of the touch region. A fourth touch electrostatic discharge line ES4 may cover the outer side of a touch signal line located on the left side and the outer side of a touch signal line extending in the second direction DR2 on the lower side of the touch region.

The touch ground lines G may be disposed between the signal lines. The touch ground lines G may include a first touch ground line G1, a second touch ground line G2, a third touch ground line G3, a fourth touch ground line G4 and a fifth touch ground line G5. The first touch ground line G1 may be disposed between the touch sensing lines RX and the first touch electrostatic discharge line ES1. The second touch ground line G2 may be disposed between the second touch electrostatic discharge line ES2 and the touch sensing lines RX. The third touch ground line G3 may be disposed between the first touch driving lines TX1_1, TX2_1, TX3_1 and TX4_1 and the third touch electrostatic discharge line ES3. The fourth touch ground line G4 may be disposed between the first touch driving lines TX1_1, TX2_1, TX3_1 and TX4_1 and the second touch driving lines TX1_2, TX2_2, TX3_2, TX4_2. The fifth touch ground line G5 may be disposed between the second touch driving lines TX1_2, TX2_2, TX3_2, TX4_2 and the fourth touch electrostatic discharge line ES4.

Figure 7:
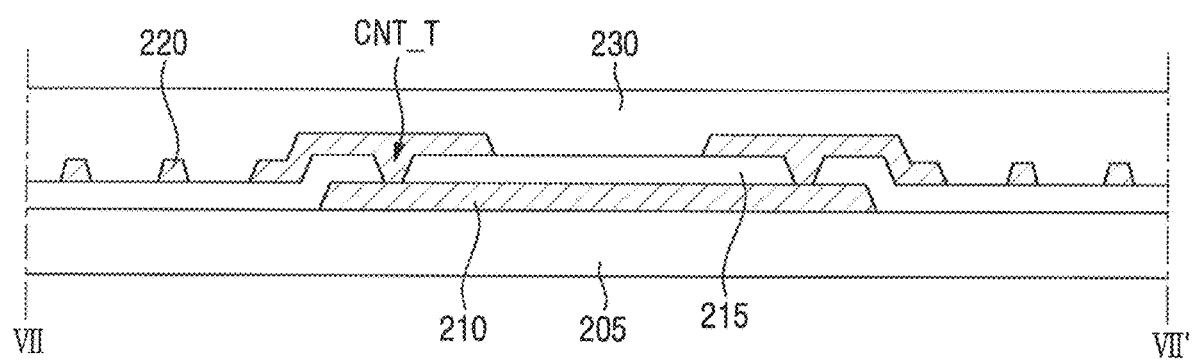
FIG. 7 is a cross-sectional view taken along line VII-VII' of FIG. 6 according to an exemplary embodiment of the present inventive concepts.

FIG. 6 is an enlarged view of a part of the touch region of FIG. 5. FIG. 7 is a cross-sectional view taken along line VII-VII' of FIG. 6.

Referring to FIGS. 5 to 7, the touch member may include a base layer 205, a first touch conductive layer 210 on the base layer 205, a first touch insulating layer 215 on the first touch conductive layer 210, a second touch conductive layer 220 on the first touch insulating layer 215 and a second touch insulating layer 230 covering the second touch conductive layer 220.

For example, as shown in the exemplary embodiment of FIG. 7, the first touch conductive layer 210 may be disposed directly on the base layer 205. The first touch conductive layer 210 may be covered by the first touch insulating layer 215. The first touch insulating layer 215 may insulate the first touch conductive layer 210 from the second touch conductive layer 220. The second touch conductive layer 220 may be disposed on the first touch insulating layer 215. The second touch insulating layer 230 may cover and protect the second touch conductive layer 220.

In an exemplary embodiment, the base layer 205 may include an inorganic insulating material. For example, the base layer 205 may include a silicon nitride layer, a silicon oxynitride layer, a silicon oxide layer, a titanium oxide layer, or an aluminum oxide layer. In some exemplary embodiments, the base layer 205 may be replaced with a second inorganic layer 193 forming a thin encapsulation layer to be described later.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanoline, graphene, etc. As described above, when the first touch conductive layer 210 and the second touch conductive layer 220 are disposed on the non-emission area, they may not interfere with the propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

In an exemplary embodiment, the first connecting parts CP1 may be formed as the first touch conductive layer 210 while the first sensor parts SP1, the second sensor parts SP2 and the second connecting parts CP2 may be formed as the second touch conductive layer 220. However, exemplary embodiments of the present inventive concepts are not limited thereto. For example, in other embodiments, the first connecting parts CP1 may be formed as the second touch conductive layer 220 while the sensor parts SP1 and SP2 and the second connecting parts CP2 may be formed as the first touch conductive layer 210. The touch signal lines may be formed as either the first touch conductive layer 210 or the second touch conductive layer 220. Alternatively, the touch signal lines may be formed both on the first touch conductive layer 210 and the second touch conductive layer 220 and may be connected by a contact. However, in exemplary embodiments of the present inventive concepts the touch conductive layers forming the elements of the sensing electrodes and the signal lines may be modified in a variety of ways.

The first touch insulating layer 215 and the second touch insulating layer 230 may include an inorganic material or an organic material. In an exemplary embodiment, the first touch insulating layer 215 or the second touch insulating layer 230 may include an inorganic material and the other may include an organic material. According to an exemplary embodiment of the present inventive concepts, the first touch insulating layer 215 may include a silicon nitride layer, a silicon oxynitride layer, a silicon oxide layer, a titanium oxide layer, or an aluminum oxide layer. The second touch insulating layer 230 may include at least one of an acrylic resin, a methacrylic resin, a polyisoprene, a vinyl resin, an epoxy resin, a urethane resin, a cellulose resin, a siloxane resin, a polyimide resin, a polyamide resin and a phenolic resin.

As shown in FIG. 7, the first touch insulating layer 215 may include a contact hole CNT_T. The first touch conductive layer 210 (e.g., the first connecting part CP1) and a part of the second touch conductive layer 220 (e.g., the first sensor part SP1) may be electrically to each other through the contact hole CNT_T.

FIG. 8 is a diagram showing the relative arrangement relationship between the pixels and the touch member in a mesh pattern in the display area according to an exemplary embodiment of the present inventive concepts.

Figure 9:
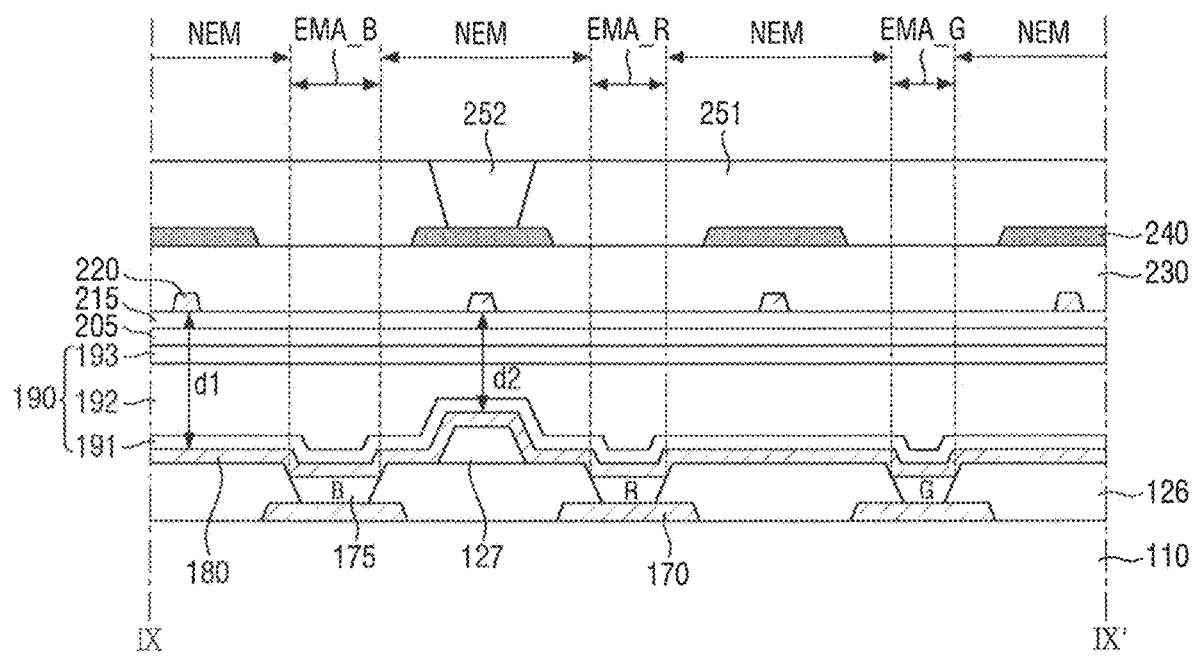
FIG. 9 is a cross-sectional view taken along line IX-IX' of FIG. 8 according to an exemplary embodiment of the present inventive concepts.

Referring to FIGS. 8-9, the display area of the active area AAR includes a plurality of pixels. Each of the pixels includes an emission area (EMA). The emission area EMA may overlap with an opening of the bank layer 126 and may be defined thereby. A non-emission area NEM may be disposed between the emission area EMA of a pixel and the emission area EMA of another pixel. The non-emission area NEM may overlap with the bank layer 126 and may be defined thereby. The non-emission area NEM may surround the emission area EMA. The non-emission area NEM may have a lattice shape or a mesh shape arranged along the diagonal directions intersecting with the first direction DR1 and the second direction DR2 when viewed from the top. The mesh pattern MSP of the touch member may be disposed in the non-emission area NEM.

The pixels may include first color pixels (e.g., red pixels), second color pixels (e.g., blue pixels), and third color pixels (e.g., green pixels). The shape of the emission area EMA of each color pixel may be generally an octagon, a square or a diamond with rounded corners. However, the present disclosure is not limited thereto and the shape of the emission area EMA may be a variety of shapes. The shape of each emission area EMA may be a circle, a diamond, or other polygons with or without rounded corners.

In an exemplary embodiment, the emission area EMA_R of the first color pixel and the emission area EMA_B of the second color pixel may have similar shapes such as a diamond shape with rounded corners. The emission area EMA_B of the second color pixel may be larger than the emission area EMA_R of the first color pixel.

In an exemplary embodiment, the emission area EMA_G of the third color pixel may be smaller than the emission area EMA_R of the first color pixel. As shown in FIG. 6, the emission area EMA_G of the third color pixel may have an octagon shape that is inclined in a diagonal direction (e.g., a direction between the first direction DR1 and the second direction DR2) and may have a maximum width in the inclined direction. The third color pixels include pixels having an emission area EMA_G1 that is inclined in a first diagonal direction, and pixels in which an emission area EMA_G2 is inclined in a second diagonal direction.

The color pixels may be arranged in a variety of ways. In the exemplary embodiment shown in FIG. 6, the first color pixels (e.g., red pixels) and the second color pixels (e.g., blue pixels) may be alternately arranged in the second direction DR2 to form a first row, while third color pixels (e.g., green pixels) may be arranged in the second direction DR2 to form a second row next to the first row. As shown in FIG. 6, the pixels belonging to the second row (the third color pixels) may be arranged in an offset manner in the second direction DR2 with respect to the pixels belonging to the first row. Therefore, the third color pixels in the second row may overlap in the first direction DR1 portions of both the first color pixels and the second color pixels of the first row. In the second row, the third color pixels that are inclined in the first diagonal direction EMA_G1 and the third color pixels that are inclined in the second diagonal direction EMA_G2 may be alternately arranged in the second direction DR2. The number of the third color pixels belonging to the second row may be twice the number of the first color pixels or the second color pixels belonging to the first row.

In the third row, the color pixels of the same colors as the first row may be arranged in the reverse order. For example, in a column of the first row where a first color pixel is disposed, a second color pixel is disposed in the same column of the third row. In a column of the first row where a second color pixel is disposed, a first color pixel may be disposed in the same column of the third row. In the fourth row, the third color pixels may be arranged like the second row but they may be arranged in the reverse order in view of the emission area shapes that are inclined with respect to first and second diagonal directions. For example, in a column of the second row where a third color pixel having an emission area EMA_G1 that is inclined in the first diagonal direction is disposed, a third color pixel having an emission area EMA_G2 that is inclined in the second diagonal direction may be disposed in the same column of the fourth row. In a column of the second row where a third color pixel having an emission area EMA_G2 inclined in the second diagonal direction is disposed, a third color pixel having an emission area EMA_1 inclined in the first diagonal direction may be disposed in the same column of the fourth row.

The arrangement of the first to fourth rows may be repeated in the first direction DR1 along the active area AAR. It is to be understood that the arrangement of the pixels is not limited to the above example.

The mesh pattern MSP of the touch member may be disposed along the boundaries of the pixels in the non-emission area NEM. The mesh pattern MSP may not overlap with the emission area EMA. In an exemplary embodiment, the width of the mesh pattern MSP of the touch member may be smaller than the width of the non-emission area NEM. In an exemplary embodiment, mesh holes MHL exposed by the mesh pattern MSP may have a substantially diamond shape. The mesh holes MHL may have substantially the same size. Alternatively, the mesh holes MI-L may have different sizes. In exemplary embodiments, the different sizes of the mesh holes MHL may or may not be dependent on the size of the emission area EMA exposed via the mesh holes MHL. Although a single mesh hole MHL is formed in a single emission area EMA in the drawing, this is merely illustrative. In some exemplary embodiments, a single mesh hole MHL may be formed across two or more emission areas EMA.

As shown in FIG. 9, a spacer 127 may be disposed in the non-emission area NEM. In an exemplary embodiment, the spacer 127 may be disposed at the intersection between a portion of the non-emission area NEM (or the bank layer 126) that is extended in the first diagonal direction and a portion thereof that is extended in the second diagonal direction. For example, the spacer 127 may be disposed at the intersection of the mesh pattern in the non-emission area NEM. The spacer 127 may be formed in an island shape when viewed from the top. The spacer 127 does not need to be disposed in every intersection but may be disposed in regular or irregular intervals, such as in the regular interval of one in every four pixels in the first direction DR1 and the second direction DR2. The position where the spacer 127 is disposed may have a step difference with respect to the nearby area, resulting in variations in touch sensitivity. In order to reduce such a difference in touch sensitivity, the dielectric constant of the part of the insulating layer which is disposed at the position where the spacer 127 is disposed may be adjusted. Detailed descriptions on this will be given later on.

FIG. 9 is a cross-sectional view taken along line IX-IX' of FIG. 8. In the cross-sectional view of FIG. 9, most of the layers under an anode electrode 170 are not shown and the structure above an organic light-emitting element is mainly shown.

Referring to FIG. 9, a substrate 110 of the display device 1 may be made of an insulating material, such as a polymer resin. For example, in exemplary embodiments the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 100 may be a flexible substrate that can be bent, folded, or rolled. An example of the material of the flexible substrate may be, but is not limited to, polyimide (PI).

The anode electrode 170 is disposed on the substrate 110. The anode electrode 170 is disposed directly on the substrate 110 for convenience of illustration. However, as it is well known in the art, in exemplary embodiments a plurality of thin-film transistors and signal lines may be disposed between the substrate 110 and the anode electrode 170.

The anode electrode 170 may be a pixel electrode disposed in each of the pixels. The anode electrode 170 may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. A layer having a higher work function may be disposed on a reflective material layer so that it is disposed closer to the emissive layer EML. The anode electrode 170 may have, but is not limited to, a multilayer structure of ITO/Mg, ITO/MgF, ITO/Ag, and ITO/Ag/ITO.

A bank layer 126 may be disposed on the substrate 110. The bank layer 126 may be disposed over the anode electrode 170 and may include an opening exposing the anode electrode 170. The emission area EMA and the non-emission area NEM may be separated by the bank layer 126 and the openings thereof. The bank layer 126 may include an organic insulating material, such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The bank layer 126 may include an inorganic material.

The spacer 127 may be disposed on the bank layer 126. For example, the spacer 127 may be disposed directly on the bank layer 126. The spacer 127 may overlap with the bank layer 126 in the thickness direction. The spacer 127 may serve to maintain a gap with elements disposed thereabove.

For example, during a process of depositing an organic layer by using a fine metal mask (FMM), the spacer 127 may prevent sagging of the fine metal mask. In some embodiments, the spacer 127 may also serve to support the elements stacked thereon and may reduce a deformation due to a stress applied when the display panel is pressed.

In an exemplary embodiment, the spacer 127 may have a width that is smaller than that of the bank layer 126. The spacer 127 may be disposed only on a portion of the bank layer 126 and accordingly there may be a step difference from the other portion of the bank layer.

In an exemplary embodiment, the spacer 127 may include an organic insulating material like the bank layer 126. However, in exemplary embodiments, the spacer 127 may be formed as a separate layer from the bank layer 126, but may be produced via the same process as the bank layer 126 with the same material. For example, the bank layer 126 and the spacer 127 having different heights may be formed via a single process by applying a photosensitive organic material and then exposing and developing it with a slit mask or a halftone mask.

An emissive layer may be disposed on the anode electrode 170 exposed via the bank layer 126. The emissive layer may include an organic layer 175. The organic layer 175 may include an organic emitting layer and may further include a hole injecting/transporting layer and/or an electron injecting/transporting layer.

A cathode electrode 180 may be disposed on the organic layer 175. The cathode electrode 180 may be a common electrode disposed across the pixels. The anode electrode 170, the organic layer 175 and the cathode electrode 180 may form an organic light-emitting element.

In an exemplary embodiment, the cathode electrode 180 may be in contact with the organic layer 175 as well as the upper surface of the bank layer 126. In addition, at the position where the spacer 127 is formed, the cathode electrode 180 may be in contact with the surface of the spacer 127 and may cover the surface of the spacer 127. The cathode electrode 180 may be formed conformally to the underlying elements to reflect the step difference of the underlying elements.

The cathode electrode 180 may include a material layer having a small work function such as Li, Ca, LiF/Ca, LiF/Al, Al, Mg, Ag, Pt. Pd. Ni, Au, Nd, Ir, Cr, BaF and Ba, or a compound or mixture thereof (e.g., a mixture of Ag and Mg). The cathode electrode 180 may further include a transparent metal oxide layer disposed on the material layer having a small work function.

A thin encapsulation layer 190 including a first inorganic layer 191, an organic layer 192 and a second inorganic layer 193 may be disposed on the cathode electrode 180. In exemplary embodiments, each of the first inorganic layer 191 and the second inorganic layer 193 may include silicon nitride, silicon oxide, silicon oxynitride, or the like. The organic layer 192 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The base layer 205, the first touch insulating layer 215, the second touch conductive layer 220 and the second touch insulating layer 230 may be sequentially disposed on the thin encapsulation layer 190. The layers have been described above; and, therefore, the redundant description will be omitted. FIG. 9 is a cross-sectional view of the sensor part, and therefore, the first touch conductive layer 210 is not shown in the cross-sectional view.

The second touch conductive layer 220 may overlap with the bank layer 126 and may be disposed in the non-emission area NEM. The second touch conductive layer 220 forms the mesh pattern MSP of the sensor parts and does not interfere with emission because it does not overlap with the emission area EMA, and may not be seen by a viewer.

A light-blocking pattern 240 may be disposed on the second touch insulating layer 230. The light-blocking pattern layer 240 may suppress reflection of external light and may improve the color of the reflected light. The light-blocking pattern 240 may be disposed in the non-emission area NEM. The light-blocking pattern 240 may have a lattice shape or a mesh shape when viewed from the top. The light-blocking pattern 240, the touch conductive layers 210 and 220 and the bank layer 126 are all disposed in the non-emission area NEM and overlap with one another in the thickness direction. In an exemplary embodiment, the width of the light-blocking pattern 240 (e.g., the length parallel to the extending direction of the top surface of the substrate 110) may be equal to or less than the width of the bank layer 126 and may be larger than the width of the touch conductive layers 210 and 220. The light-blocking pattern 240 may not overlap with the emission area EMA.

On the light-blocking pattern 240, overcoat layers 251 and 252 may be disposed. The overcoat layers 251 and 252 may be disposed directly over the light-blocking pattern 240. The overcoat layers 251 and 252 may cover and protect the light-blocking pattern 240. In some exemplary embodiments, the overcoat layers 251 and 252 may also provide a flat surface (e.g., provide a planarization function). The overcoat layers 251 and 252 may have different dielectric constants in regions overlapping the spacer 127 in the thickness direction as opposed to the other regions which do not overlap the spacer 127 in the thickness direction. To have different dielectric constants for different positions, the overcoat layers 251 and 252 may include a first overcoat layer 251 and a second overcoat layer 252 having different dielectric constants. The first overcoat layer 251 may be in contact with the second overcoat layer 252. The second overcoat layer 252 may overlap the position where the spacer 127 is formed in the thickness direction. The first overcoat layer 251 may be disposed in regions that do not overlap the spacer in the thickness direction. The first overcoat layer 251 and the second overcoat layer 252 may not substantially overlap with each other in the thickness direction. For example, the first overcoat layer 251 and the second overcoat layer 252 may not substantially overlap with each other in the thickness direction except for the adjacent inclined side surfaces in contact with each other.

The dielectric constants of the first overcoat layer 251 and the second overcoat layer 252 are associated with the touch sensitivity. The touch sensitivity may be highly dependent on a first capacitance from a touch input position (for example, the surface of the protective layer in FIG. 3) to the touch member on the touch layer TSL. However, the touch sensitivity may also be dependent on a second capacitance between the touch member of the touch layer TSL and the electrodes disposed below the touch member. The first capacitance is a value that may be directly used to determine whether or not there is a touch input. The larger the value is, the more the touch sensitivity may be increased. The second capacitance may work as a parasitic capacitance when it is determined whether or not there is a touch. Accordingly, the touch sensitivity may be reduced as the value of the second capacitance increases.

Simulations have been carried out to see such relationships. Specifically, a signal-to-noise ratio (SNR) was measured for a sample group #1 having the structure shown in FIG. 3 in which the light-blocking pattern layer BML is disposed on the touch layer TSL and the overcoat layers having different dielectric constants were disposed on the light-blocking pattern layer. In addition, a signal-to-noise ratio (SNR) was measured for a sample group #2 having the structure in which the light-blocking pattern layer BML was disposed under the touch layer TSL and the overcoat layers having different dielectric constants were disposed between the light-blocking pattern layer and the touch layer as shown in FIG. 4. The results are shown in Table 1.

TABLE 1

| Dielectric Constant (k) | 2 | 3 | 5 | 10 | 50 |
|---|---|---|---|---|---|
| Sample Group #1 | 14.24 | 14.55 | 14.86 | 15.15 | 15.42 |
| Sample Group #2 | 17.46 | 17.45 | 17.43 | 17.38 | 17.28 |

It can be seen from Table 1 that the touch sensitivity was increased as the dielectric constants were increased in the sample group #1, whereas the touch sensitivity was decreased as the dielectric constants were increased in the sample group #2.

In the exemplary embodiment shown in FIG. 9, the position where the spacer 127 is formed protrudes upward as compared with the other positions where the spacer 127 is not formed, and accordingly the height of the cathode electrode 180 also increases at that position. Accordingly, the distance between the second touch conductive layer 220 and the cathode electrode 180 may be varied depending on whether or not the spacer 127 is located. A first distance d1 between the cathode 180 and the second touch conductive layer 220 in the position where the spacer 127 is not formed is greater than a second distance d2 between the cathode electrode 180 and the second touch conductive layers 220. As the distance becomes smaller, the capacitance at that position becomes larger, so that the touch sensitivity may be relatively reduced in the position where the spacer 127 is disposed. Therefore, in order to maintain a generally uniform touch sensitivity, it is necessary to increase the touch sensitivity of the position where the touch sensitivity is relatively lowered.

The exemplary embodiment of FIG. 9 corresponds to the sample group #1 in which the overcoat layers 251 and 252 are disposed on the touch member. Therefore, by increasing the second dielectric constant of the second overcoat layer 252 disposed at a position overlapping the spacer 127 in the thickness direction to be larger than the first dielectric constant of the first overcoat layer 251 disposed in regions not overlapping the spacer, it is possible to compensate for the touch sensitivity. Therefore, the second dielectric constant of the second overcoat layer 252 may be greater than the first dielectric constant of the first overcoat layer 251. The differences in the dielectric constants of the first overcoat layer 251 and the second overcoat layer 252 reduces variations in touch sensitivity of the display device resulting from the step difference caused by the spacer 127.

The second overcoat layer 252 may be disposed on the light-blocking pattern 240 overlapping the spacer 127 and may have a smaller width (e.g., in the extending direction of the top surface of the substrate 110) than the light-blocking pattern 240. The edge portion of the light-blocking pattern 240 overlapping with the spacer 127 may be covered by the first overcoat layer 251.

In an exemplary embodiment, the first overcoat layer 251 and the second overcoat layer 252 may be formed via a patterning process. For example, the first overcoat layer 251 having an exposed opening may be formed first by applying a first photosensitive organic material at the position overlapping where the spacer 127 is formed in the thickness direction. The first photosensitive organic material may then be exposed and developed. The second overcoat layer 252 may be formed by applying a second photosensitive organic material and exposing and developing it, so that the opening is filled with the second overcoat layer 252. In an exemplary embodiment, the second overcoat layer 252 may be formed via a process of filling the opening without performing a patterning process.

The upper surfaces of the first overcoat layer 251 and the second overcoat layer 252 may be substantially flat as shown in FIG. 9. For example, the distance between the top of the substrate 110 and the upper surface of the first overcoat layer 251 may be substantially equal to the distance between the top surface of the substrate and the upper surface of the second overcoat layer 252. In order to form such a structure, a planarization process such as chemical mechanical polishing may be further employed.

In another exemplary embodiment, the second overcoat layer 252 may be formed first, and the first overcoat layer 251 may be subsequently formed.

The shapes and arrangements of the first overcoat layer 251 and the second overcoat layer 252 may be modified in a variety of ways. Hereinafter, other exemplary embodiments of the present disclosure will be described.

FIGS. 10 to 15 are cross-sectional views of display devices according to a variety of exemplary embodiments.

Figure 10:
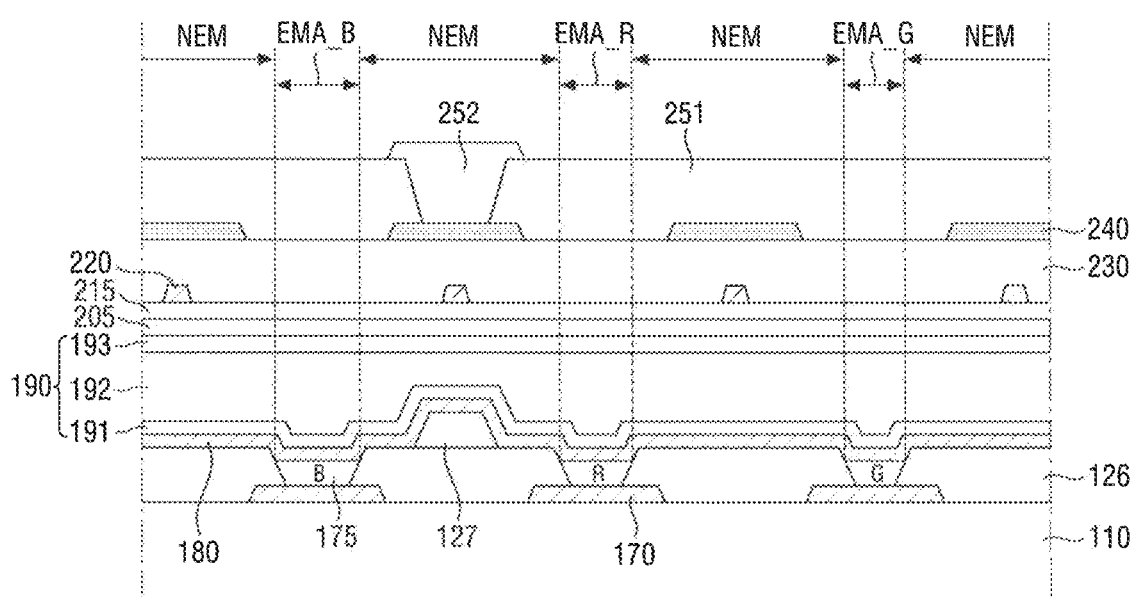
FIGS. 10 to 15 are cross-sectional views of display devices according to a variety of exemplary embodiments of the present inventive concepts.
Figure 11:
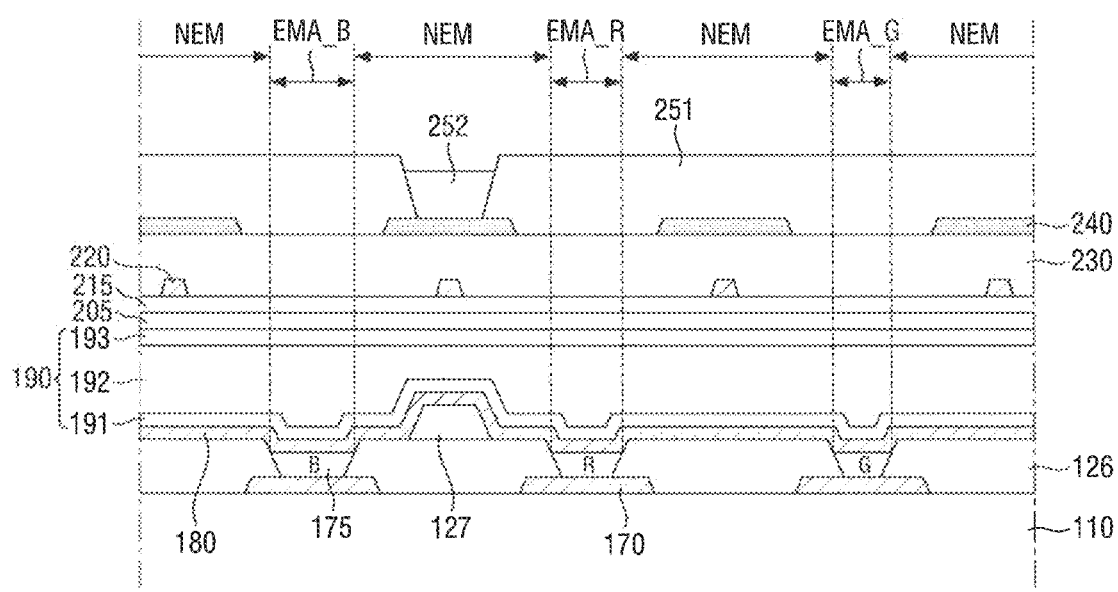

According to the exemplary embodiments shown in FIGS. 10 and 11, the surface height of the first overcoat layer 251 may be different from the surface height of the second overcoat layer 252.

For example, the top surface of the second overcoat layer 252 may protrude further above the surface of the first overcoat layer 251, as shown in FIG. 10. The opening of the first overcoat layer 251 may be completely filled with the second overcoat layer 252, and the second overcoat layer 252 may partially overflow to the nearby first overcoat layer 251. In this exemplary embodiment, the distance between a top surface of the second overcoat layer 252 to a top surface of the substrate 110 is greater than the distance between the top surface of the first overcoat layer 251 and the top surface of the substrate.

In another exemplary embodiment shown in FIG. 11, the surface of the second overcoat layer 252 may be depressed below the surface of the first overcoat layer 251. The second overcoat layer 252 may be formed as shown in FIG. 11 in which the opening of the first overcoat layer 251 is not completely filled. In this exemplary embodiment, the distance between a top surface of the second overcoat layer 252 to a top surface of the substrate 110 is less than the distance between the top surface of the first overcoat layer 251 and the top surface of the substrate.

Also according to the exemplary embodiments shown in FIGS. 10 and 11, the second overcoat layer 252 having a relatively high dielectric constant may be disposed at the region overlapping the spacer 127 in the thickness direction, so that the touch sensitivity at that position can be compensated.

Figure 12:
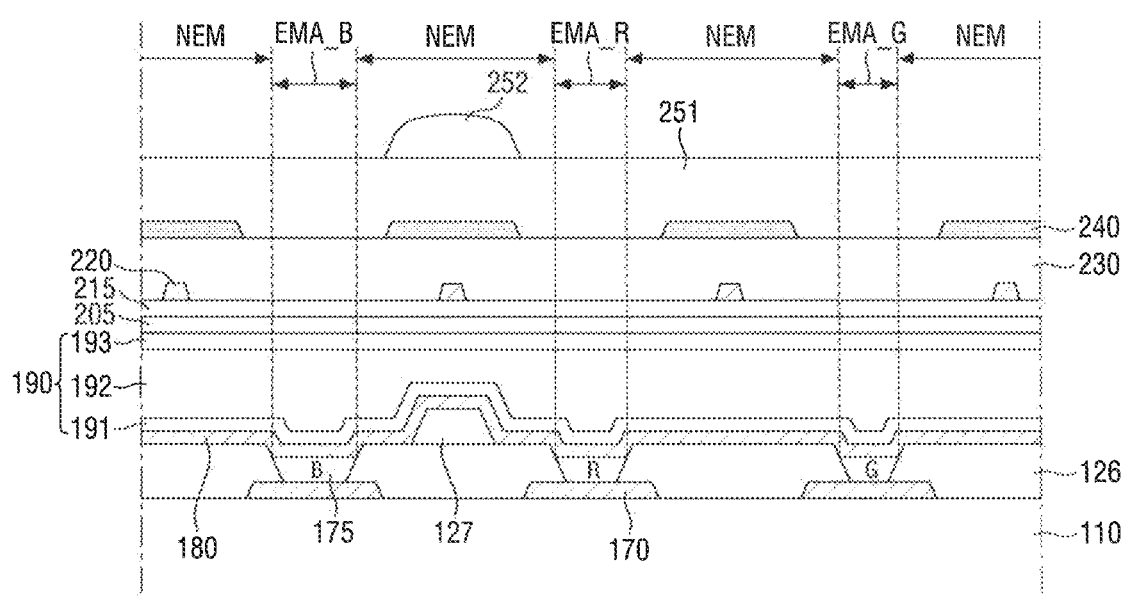
Figure 13:
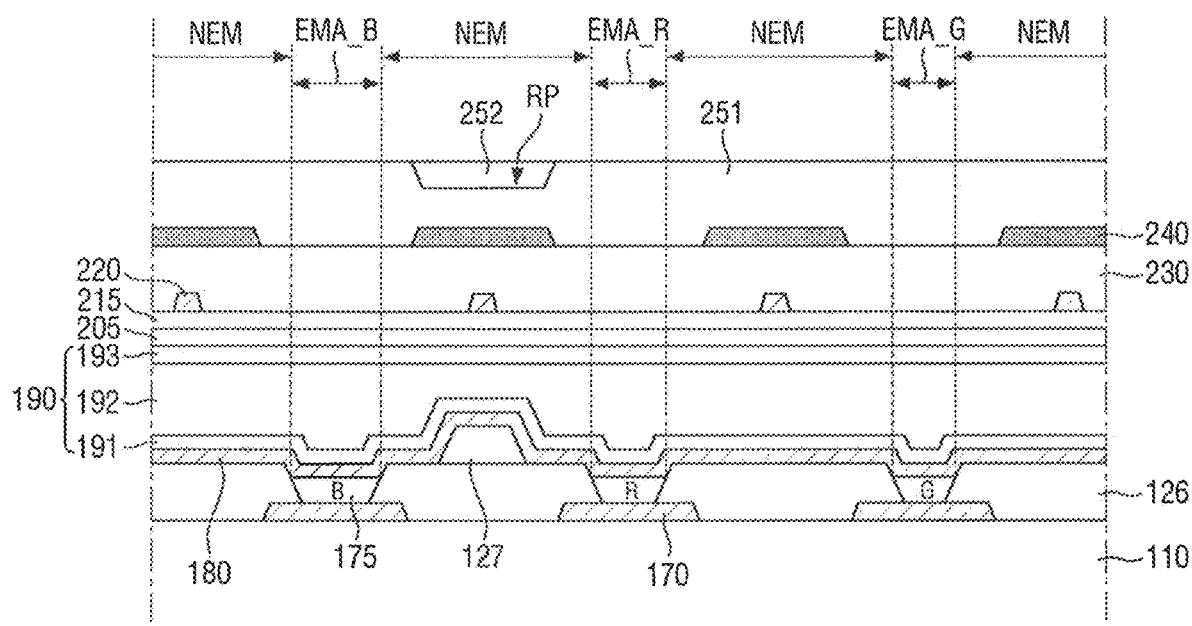
Figure 14:
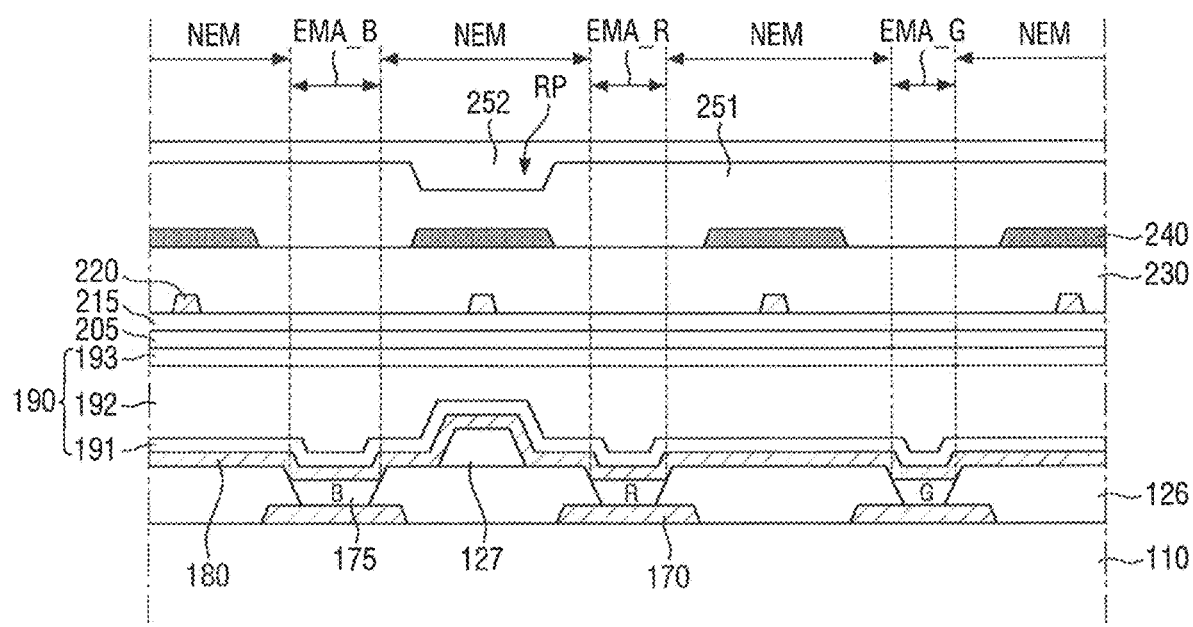

According to the exemplary embodiments shown in FIGS. 12 to 14, the second overcoat layer 252 may overlap with the first overcoat layer 251 in the thickness direction.

According to the exemplary embodiment of FIG. 12, the first overcoat layer 251 may not include an opening at the position where the spacer 127 is formed and has a substantially flat upper surface. The second overcoat layer 252 may be disposed on the first overcoat layer 251 at a position overlapping the spacer 127 in the thickness direction. According to the exemplary embodiments of the present inventive concepts, the second overcoat layer 252 having a relatively high dielectric constant may be further disposed at a position overlapping the spacer 127 in the thickness direction so that the capacitance at that position may be increased and accordingly the touch sensitivity may be compensated.

According to the exemplary embodiment of FIG. 13, the first overcoat layer 251 may include a recessed portion RP having a predetermined depth at the position where the spacer 127 is formed, instead of an opening penetrating the first overcoat layer 251. The recessed portion is filled with second overcoat layer 252. According to the exemplary embodiment of the present inventive concepts, the second overcoat layer 252 having a relatively high dielectric constant may be disposed in the region overlapping the spacer 127 in the thickness direction, the capacitance of that position may be increased and accordingly the touch sensitivity may be compensated.

According to the exemplary embodiment of FIG. 14, the first overcoat layer 251 may be formed in substantially the same manner as that of the exemplary embodiment of FIG. 13 except that the second overcoat layer 252 may be formed in the recessed portion RP and has a height that extends above the recessed portion and covers the entire first overcoat layer 251. In this embodiment, the thickness of the second overcoat layer 252 at the position overlapping the spacer 127 in the thickness direction may be formed is larger than the thickness at the position where the spacer 127 is not formed. According to the exemplary embodiment of the present inventive concepts, the second overcoat layer 252 having a relatively high dielectric constant may be disposed with a larger thickness in the position overlapping the spacer 127 in the thickness direction, the capacitance of that position may be increased and accordingly the touch sensitivity may be compensated.

Figure 15:
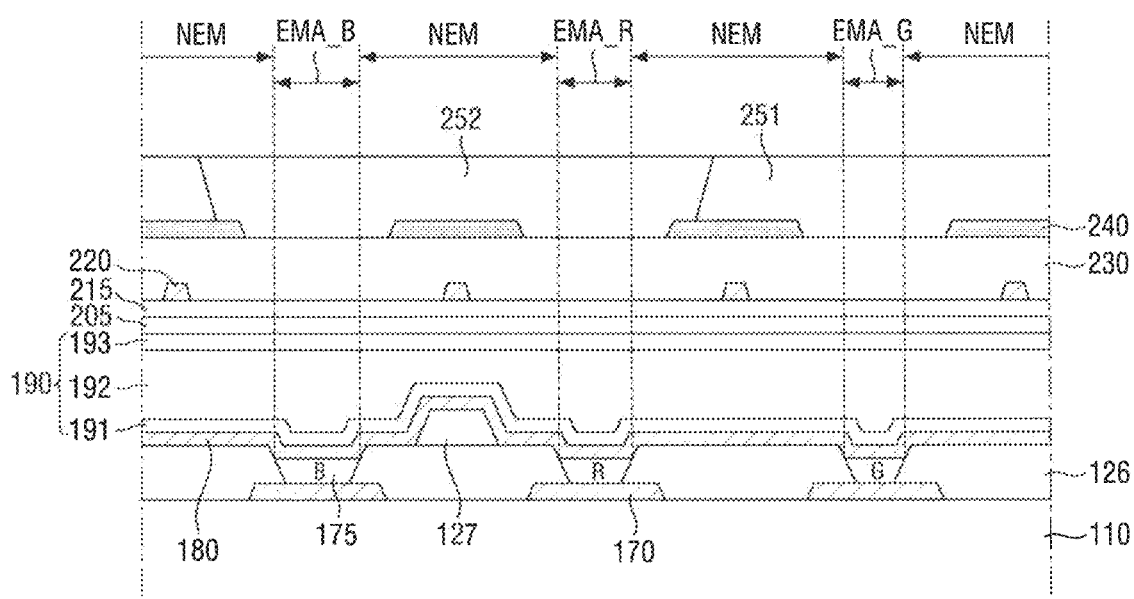

The exemplary embodiment of FIG. 15 illustrates that the width (e.g., the length in a direction parallel to the top surface of the substrate 110) of the second overcoat layer 252 may be further extended. Referring to FIG. 15, a second overcoat layer 252 may be wider than a light-blocking pattern 240 and the spacer 127. The second overcoat layer 252 not only completely covers the light-blocking pattern 240 at the region overlapping the spacer 127 in the thickness direction but also partially covers the nearby light-blocking pattern 240. However, if the second overcoat layer 252 overlaps with the second touch conductive layer 220 at the position where the spacer 127 is not formed, the touch sensitivity of that position may be further increased to result in variations in touch sensitivity. Therefore, the width of the second overcoat layer 252 may be limited to a range in which it does not overlap with the second touch conductive layer 220 near the region overlapping the spacer 127 in the thickness direction.

Figure 16:
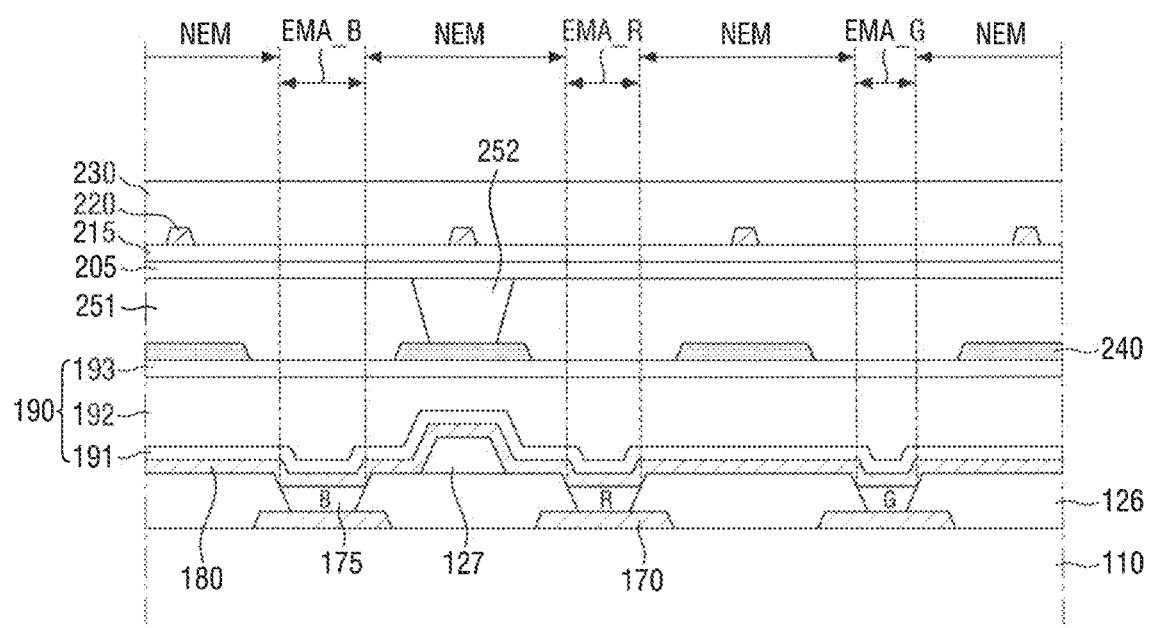
FIG. 16 is a cross-sectional view of a display device according to yet another exemplary embodiment of the present inventive concepts.

FIG. 16 is a cross-sectional view of a display device according to yet another exemplary embodiment of the present disclosure.

The exemplary embodiment of FIG. 16 is different the exemplary embodiment of FIG. 9 in that a light-blocking pattern 240 may be located below a touch conductive layer 220 similarly to the exemplary embodiment of FIG. 4. According to this exemplary embodiment of the present disclosure, as discussed above with respect to Table 1, the touch sensitivity decreases as the dielectric constant increases. Accordingly, the second dielectric constant of the second overcoat layer 252 disposed at the position overlapping the spacer 127 in the thickness direction may be smaller than the first dielectric constant of the first overcoat layer 251 in order to compensate for the touch sensitivity. In this way, it is possible to reduce variations in touch sensitivity of the display device resulted from the step difference. The overcoat layers 251 and 252 according to this exemplary embodiment may be substantially identical to the exemplary embodiments of FIGS. 9 to 15 except that the second dielectric constant is smaller than the first dielectric constant. Therefore, it will be apparent to those skilled in the art that modifications may be made in the same manner in this exemplary embodiment.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a substrate;
   a bank layer disposed on the substrate and defining an emission area and t anon-emission area of a pixel;
   a spacer disposed on a portion of the bank layer in the non-emission area of the pixel;
   a touch member disposed above the spacer; and
   at least one overcoat layer disposed on the touch member, wherein a dielectric constant of the at least one overcoat layer in a region overlapping the spacer in a thickness direction of the substrate is larger than dielectric constant of the at least one overcoat layer in a region that does not overlap the spacer in the thickness direction of the substrate.

2. The display device of claim 1, wherein the at least, one overcoat layer comprises:
   a first overcoat layer having a first dielectric constant, the first overcoat layer positioned in the region that does not overlap the spacer in the thickness direction of the substrate; and
   a second overcoat layer having a second dielectric constant that is greater than the first dielectric constant, the second overcoat layer positioned in the region that overlaps the spacer in the thickness direction of the substrate.

3. The display device of claim 2, wherein the first overcoat layer is in contact with the second overcoat layer and substantially does not overlap with the second overcoat layer in the thickness direction of the substrate.

4. The display device of claim 3, wherein a distance of a top surface of the first overcoat layer to a top surface of the substrate is substantially equal to a distance of a top surface of the second overcoat layer to the top surface at the substrate.

5. The display device of claim 2, wherein the touch member comprises a touch conductive layer that is positioned in the non-emission area.

6. The display device of claim 5, wherein the touch conductive layer comprises an opaque metal.

7. The display device of claim 6, wherein the touch conductive layer comprises a first touch conductive layer and a second touch conductive layer, and wherein the touch member comprises the first touch conductive layer, a first touch insulating layer disposed on the first touch conductive layer, the second touch conductive layer disposed on the first touch insulating layer, and a second touch insulating layer disposed on the second touch conductive layer.

8. The display device of claim 7, wherein the touch member comprises sensing electrodes comprising sensor parts in a mesh pattern.

9. The display device of claim 5, wherein the second overcoat layer overlaps with a portion of the touch conductive layer overlapping the spacer it the thickness direction of the substrate, and does not overlap with a portion of the touch conductive layer that does not overlap the spacer in the thickness direction of the substrate.

10. The display device of claim 2, further comprising: a light-blocking pattern disposed on the touch member and overlapping with the bank layer in the thickness direction of the substrate, wherein the light-blocking pattern is disposed between the touch member and the at least one overcoat laver.

11. The display device of claim 10, wherein the second overcoat layer is disposed on the light-blocking pattern and has a width that is smaller than a width of the light-blocking pattern.

12. The display device of claim 1, wherein the spacer is disposed directly on the portion of the bank layer.

13. A display device comprising:
   a substrate;
   a bank layer disposed on the substrate and defining an emission area and a non-emission area of a pixel;
   a spacer disposed on a portion of the bank layer in the non-emission area of the pixel;
   at least one overcoat layer disposed on an encapsulation layer disposed above the bank laver; and
   a touch member disposed on the at least one overcoat layer,
   wherein a dielectric constant of the at least one overcoat layer in a region overlapping the spacer in a thickness direction of the substrate is smaller than a dielectric constant of the overcoat layer in a region that does not overlap the spacer in the thickness direction of the substrate.

14. The display device of claim 13, wherein the at least one overcoat layer comprises:
   a first overcoat layer having a first dielectric constant, the first overcoat layer positioned in the region that does not overlap the spacer in the thickness direction of the substrate; and
   a second overcoat layer having a second dielectric constant that is smaller than the first dielectric constant, the second overcoat layer positioned in the region that overlaps the spacer in the thickness direction of the substrate.

15. The display device of claim 14, wherein the touch member comprises a touch conductive layer that is positioned in the non-emission area.

16. The display device of claim 15, wherein the touch conductive layer comprises an opaque metal.

17. The display device of claim 16, wherein the touch conductive layer comprises a first touch conductive layer and a second touch conductive layer, and wherein the touch member comprises the first touch conductive layer, a first touch insulating layer disposed on the first touch conductive layer, the second touch conductive layer disposed on the first touch insulating layer, and a second touch insulating layer disposed on the second touch conductive layer.

18. The display device of claim 17, wherein the touch member comprises sensing electrodes comprising sensor parts in a Mesh pattern.

19. The display device of claim 15, wherein the second overcoat layer overlaps with a portion of the touch conductive layer overlapping the spacer in the thickness direction of the substrate, and does not overlap with a portion of the touch conductive layer that does not overlap the spacer in the thickness direction of the substrate.

20. The display device of claim 14, further comprising: a light-blocking pattern disposed on the encapsulation layer and overlapping with the bank layer in the thickness direction of the substrate, wherein the light-blocking pattern is disposed between the encapsulation layer and the at least one overcoat layer.

21. The display device of claim 20, wherein the second overcoat layer is disposed on the light-blocking pattern and has a width that is smaller than a width of the light-blocking pattern.

22. The display device of claim 13, wherein the spacer is disposed directly on the portion of the bank layer.

* * * * *